United States Patent [19]

Uragami et al.

[11] Patent Number: 4,678,943
[45] Date of Patent: Jul. 7, 1987

[54] INVERTING LOGIC BUFFER BICMOS SWITCHING CIRCUIT USING AN ENABLING SWITCH FOR THREE-STATE OPERATION WITH REDUCED DISSIPATION

[75] Inventors: Akira Uragami, Takasaki; Yukio Suzuki, Hinode; Shinji Kadono, Fussa; Masahiro Iwamura, Hitachi; Ikuro Masuda, Hitachi; Tatsumi Yamauchi, Hitachi, all of Japan

[73] Assignee: Hitachi, Ltd., Tokyo, Japan

[21] Appl. No.: 704,209

[22] Filed: Feb. 22, 1985

[30] Foreign Application Priority Data

Feb. 24, 1984 [JP] Japan .................................. 59-32357

[51] Int. Cl.$^4$ ............................................. H03K 17/04
[52] U.S. Cl. ..................... 307/473; 307/443; 307/446; 307/570; 307/270
[58] Field of Search ............... 307/443, 446, 448, 451, 307/473, 475, 570, 585, 270

[56] References Cited

U.S. PATENT DOCUMENTS

| | | | |
|---|---|---|---|
| 3,541,353 | 11/1970 | Seelbach et al. | 307/446 |
| 4,280,065 | 7/1981 | Minato et al. | 307/473 |
| 4,322,640 | 3/1982 | Fukushima et al. | 307/473 |
| 4,488,067 | 12/1984 | Kraft et al. | 307/473 |
| 4,542,310 | 9/1985 | Ellis et al. | 307/473 X |

FOREIGN PATENT DOCUMENTS

| | | | |
|---|---|---|---|
| 0058958 | 9/1982 | European Pat. Off. | 307/446 |
| 0099100 | 1/1984 | European Pat. Off. | 307/570 |
| 28726 | 2/1984 | Japan | 307/446 |
| 25423 | 2/1984 | Japan | 307/446 |
| 25424 | 2/1984 | Japan | 307/446 |
| 79641 | 5/1984 | Japan | 307/446 |

OTHER PUBLICATIONS

Griffin et al, "Low Power Tri-State Driver Circuit", *IBM Tech. Discl. Bull.*, vol. 24, No. 5, pp. 2556–2557, 10/1981.

Kraft et al, "Tristate Driver Utilizing Bipolar-Complementary MOS Technology", *IBM-TDB;* vol. 16, No. 8, pp. 2677–2678; 1/1974.

Lin et al, "Complementary MOS-Bipolar Transistor Structure"; IEEE/Trans. on E/D; vol. ED-16, No. 11, pp. 945–951; 11/1969.

*Primary Examiner*—Stanley D. Miller
*Assistant Examiner*—D. R. Hudspeth
*Attorney, Agent, or Firm*—Antonelli, Terry & Wands

[57] ABSTRACT

A switching circuit comprises a pre-stage circuit coupled to receive an input signal and an output stage, wherein an output signal having a phase opposite to that of a signal of an input terminal IN can be obtained from an output terminal OUT of the output stage. The pre-stage circuit includes a p-channel MOSFET M1 and an n-channel MOSFET M2 that receive input signals at their gates. The output stage includes two NPN transistors Q1 and Q2 that are connected in series. The drain output of the p-channel MOSFET M1 is applied to the base of one of the transistors of the output stage, and the source output of the n-channel MOSFET M2 is applied to the base of the other of the transistors of the output stage. A third MOSFET M3 is coupled between a power supply and the p-channel MOSFET M1 and the n-channel MOSFET M2. When the MOSFET M3 is rendered non-conductive by a control signal EN, both MOSFETs M1 and M2 and both NPN transistors Q1 and Q2 become non-conductive irrespective of the signal of the input terminal IN. Under this condition, the output terminal OUT is in a floating state. Thus, the switching circuit is a tri-state circuit.

13 Claims, 10 Drawing Figures

INVERTING LOGIC BUFFER BICMOS SWITCHING CIRCUIT USING AN ENABLING SWITCH FOR THREE-STATE OPERATION WITH REDUCED DISSIPATION

BACKGROUND OF THE INVENTION

This invention relates to switching circuit techniques such as output circuit techniques, and further to circuit techniques which are particularly effective when applied so as to drive a d.c. load in circuits such as those employing TTL. The present invention relates to a technique which can be effectively utilized for a buffer circuit producing a CMOS logic level at the TTL level in a Bi-CMOS type (bipolar/CMOS mixed type) gate array, for example.

H. C. Lin et al disclose Bi-CMOS type inverters and logic gates of the kind described above in the reference "IEEE TRANSACTIONS ON ELECTRON DEVICES", Vol. ED-16, No. 11, November 1969, p.p. 945-951. The Bi-CMOS type inverter disclosed by H. C. Lin et al includes an output stage consisting of a pair of bipolar transistors connected in series in a totem pole arrangement, and a pre-stage circuit consisting of a p-channel MOS field effect transistor and an n-channel MOS field effect transistor. The gates of both MOS field effect transistors of the pre-stage circuit are driven in common by a single input signal. The drain output of the p-channel MOS field effect transistor is applied to the base of one of the bipolar transistors, and the source output of the n-channel MOS field effect transistor is applied to the base of the other transistor of the output stage. An output signal having a phase opposite to that of the input signal can thus be obtained from the common junction of the pair of transistors.

Therefore, the Bi-CMOS type inverter of H. C. Lin at al can accomplish low standby power as well as large driving capability.

Five inventors among the inventors of the present application invented previously a high speed, low power consumption Bi-CMOS type semiconductor integrated circuit having the construction in which an internal logic circuit is operated at a CMOS level, the output transistor in a peripheral circuit as an input level converter or an output level converter consists of a bipolar transistor, and this output transistor charges or discharges the output capacity of the peripheral circuit (Japanese Patent Application No. 12711/1983, U.S. patent application No. 575,567, British Patent Application No. GB 2,135,148A, West German Patent Application No. P 34 03 276.2 and Korean Patent Application No. 1983-5666).

The output stage of the output buffer circuit used as the peripheral circuit described above consists of bipolar transistors so that the "L" (low level) logic level can be kept below a predetermined level even when a large number of TTLs are connected to its output, that is, in order to obtain large fan-outs.

FIG. 1 shows the output buffer circuit 10 invented by the five inventors among the inventors of the present invention prior to the present invention.

The buffer circuit 10 shown in the drawing is arranged so that its logic output can assume a high impedance floating condition in addition to the binary logic stage of "H" (high level) and "L" (low level). In other words, the logic circuit 10 is constructed in a "tri-state" configuration, and can therefore be used by connecting it to the signal bus of a micro-computer system, for example.

Its circuits construction is based upon that of TTL, and its output stage consists of a pair of bipolar transistors Q1 and Q2 connected in series in a totem-pole arrangement between the power source Vcc and the ground potential, a resistor R1, and the like. The buffer output can be taken out from the intermediate junction of the pair of bipolar transistors Q1 and Q2. Another bipolar transistor Q4 is Darlington-connected to the base of one of these bipolar transistors (e.g. Q1).

A pre-stage circuit for complementarily driving the pair of bipolar transistors Q1 and Q2 consists of a phase spliting circuit consisting in turn of a bipolar transistor Q3 and a resistor R2, and an input circuit consisting of an n-channel MOS field effect transistor M1 and a resistor R3. The buffer input IN is connected to the gate of the field effect transistor M1. A bipolar transistor Q5 and resistors R4 and R5 are also disposed in order to extract the base residual charge of the bipolar transistor Q2 of the output stage.

The circuit arrangement described above can convert a CMOS level logic signal from an internal circuit 20 consisting of a CMOS logic circuit, for example, to a high driving capability logic signal of the TTL level and can produce the latter as an output.

Furthermore, an enable control circuit 30 is added to the buffer circuit 10 so that it can operate as a tri-state buffer circuit. The enable control circuit 30 consists, for example, of a bi-polar transistor Q30 subjected to switching control by an enable signal EN generated by the internal circuit 20, for example, diodes D30 and D31, and so forth. When the enable signal EN is "H" in this circuit 30, the n-channel field effect transistor M0 is turned ON (becomes conductive) while the transistors Q20 and Q30 are turned OFF (becomes non-conductive, so that the output OUT of the output buffer circuit 10 is under the active condition in which it takes either one of the two logic states "H" and "L" in response to the buffer input IN. When the enable signal EN becomes "L", the transistor Q30 is turned ON (becomes conductive), whereupon the collector and base current of the transistor Q3 of the phase splitting circuit are forcibly bypassed through the paths of the diodes D30 and D31 and the transistor Q30 (represented by solid line), both transistors Q1 and Q2 of the output stage are turned OFF irrespective of the stage of the buffer input IN, and the output OUT is in a floating condition, that is, in the high impedance condition. Thus, the output OUT of the buffer circuit 10 is rendered non-active.

As described above, the buffer circuit can operate as a tri-state buffer circuit. When its output OUT is connected to the signal bus inside a micro-computer system, for example, electric connection state with respect to the signal bus can be freely controlled by the enable signal.

However, the inventors have clarified the fact that in accordance with the technique described above, the operating current of the pre-stage circuit is forcedly bypassed by the diodes D30, D31 and the transistor Q30 to render the output OUT high impedance, and so long as the output OUT is kept at the high impedance, a d.c. current flows through the transistors Q20 and Q30 and the power consumption or so-called standby power becomes inevitably great.

SUMMARY OF THE INVENTION

The present invention is directed to provide a technique which can drastically reduce the power consumption necessary for keeping the output of a tri-state type switching circuit under a high impedance inactive condition.

The above and other objects and novel features of the present inventio will become more apparent from the following description to be studied in conjunction with the accompanying drawings.

Among the inventors disclosed herein, the following will illustrate the outline of a typical example.

A switching element is interposed in series in the operating power supply path of a pre-stage circuit which drives an output stage, and is controlled by an enable signal, thereby accomplishing the object of the invention to drastically reduce the power consumption necessary for keeping the output under the high impedance non-active condition.

DESCRIPTION OF THE PREFERRED EMBODIMENTS

Figure 1:
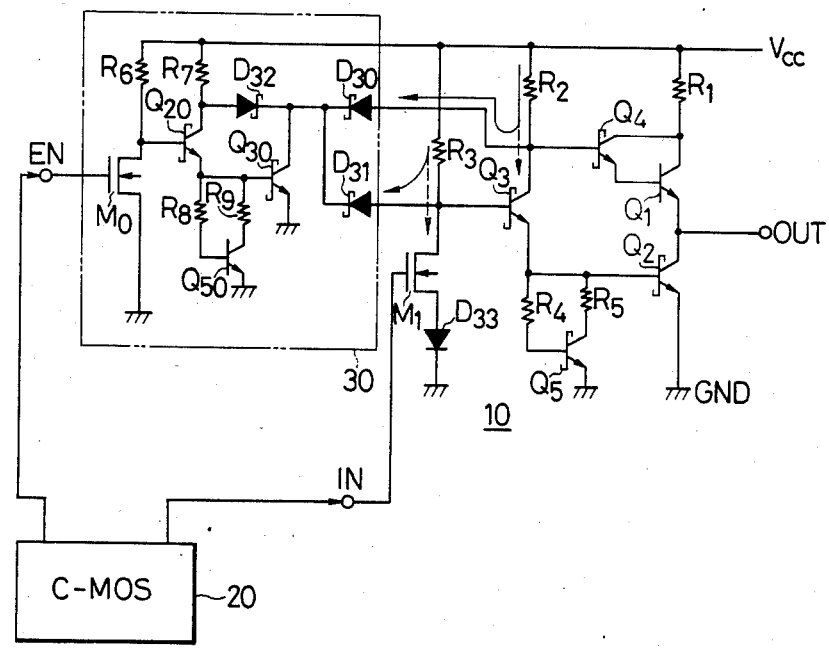
FIG. 1 is a circuit diagram of a buffer circuit invented by the five of the inventors of this application prior to the present invention.

Hereinafter, typical embodiments of the present invention will be described with reference to the accompanying drawings.

In the drawings, like reference numerals are used to identify the same or corresponding constituents or portions.

Figure 2:
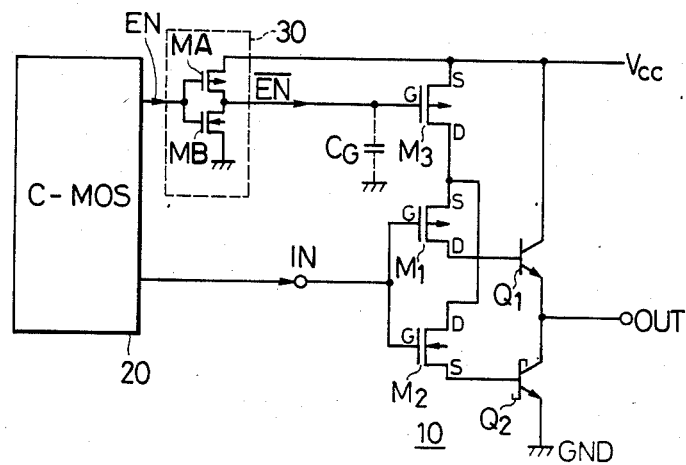
FIG. 2 is a circuit diagram of the buffer circuit in accordance with a first embodiment of the invention.

FIG. 2 is a circuit diagram of a tri-state buffer circuit in accordance with a first embodiment of the invention.

The buffer circuit 10 shown in the circuit diagram is constituted as the output buffer circuit 10 of a Bi-CMOS gate array, for example. A logic signal from an internal circuit 20 consisting of a CMOS logic circuit is applied to its input IN, and a logic signal of a TTL level having great fanout is produced from its output OUT.

This tri-state type output buffer circuit 10 is constituted by an output stage consisting of a pair of bipolar transistors Q1 and Q2 connected in series in a totem pole type, a pre-stage circuit consisting of a p-channel MOS field effect transistor M1 and an n-channel MOS field effect transistor M2, and a p-channel MOS field effect transistor M3 as a switching element that is interposed in series in an operating power supply path of the pre-stage circuit.

In the pre-stage circuit described above, the source electrode S of the p-channel MOS field effect transistor M1 and the drain electrode D of the n-channel MOS field effect transistor M2 are connected to a positive power source Vcc through the drain-source path of the p-channel MOS field effect transistor M3, and the gate electrodes G of both field effect transistors M1 and M2 are connected in common to the input terminal IN.

The drain electrode D of one (M1) of the p-channel MOS field effect transistors is connected to the base of one (Q1) of the transistors in the output stage, and the source electrode S of the other n-channel MOS field effect transistor M2 is connected to the base of the other (Q2) of the transistors of the output stage. An enable signal EN generated from the internal circuit 20 is applied to thegate electrode G of the p-channel MOS field effect transistor M3 as the switching element, through an enable control circuit 30. This enable control circuit 30 is a CMOS inverter.

The bipolar transistor Q2 with its base illustrated by an elongated S is a Schottky transistor incorporating therein a clamping Schottky barrier diode.

in FIG. 2, when the logic state of the enable signal EN on the input side of the enable control circuit 30 is "H" and its inversion enable signal $\overline{EN}$ is "L", the p-channel MOS field effect transistor M3 interposed in series in the power supply path is turned ON (becomes conductive), and an operating current is supplied to the pre-stage circuit. Under this state, the transistor Q1 is On when the input IN is "L", while the transistor Q2 is turned OFF when the transistor M2 is turned OFF (non-conductive), so that the "H" logic state appears at the output OUT. When the input IN is "H", the transistor M1 is turned OFF and the transistor Q1 is OFF, while the transistor Q2 is turned ON as the transistor M2 is turned ON, thereby generating the "L" logic stage at the output OUT. In other words, a kind of inverter function is obtained in the active condition of the output OUT by inverting the logic signal of the CMOS level applied to the input IN to produce an output of the TTL level.

Now, when the logic state of the enable signal EN is "L", the MOS field effect transistor M3 is turned OFF, whereupon the operating current of each of the transistors M1 and M2 of the pre-stage circuit is cut off, and no current is supplied to the two transistors Q1 and Q2 of the output stage. Consequently, these two transistors are turned OFF so that the output OUT is in a floating condition, that is, in a high impedance non-active condition, irrespective of the logic state of the input IN.

The operation of the tri-state type output buffer circuit can be obtained in the manner described above. Here, it is noteworthy that the power consumption of the CMOS enable circuit 30 is extremely small.

When the switching MOS field effect transistor M3 is turned OFF, the MOS field effect transistor MA is turned OFF after charge of the gate capacitance $C_G$ of the transistor M3 is completed, and the power consumption of the CMOS enable control circuit becomes zero. When the MOS field effect transistor M3 is turned ON, the transistor MB is turned OFF as the discharge of the stored charge of the gate capacitance $C_G$ of the transistor M3 is completed, and the power consumption of the CMOS enable control circuit becomes also zero. This means that conduction control of the switching MOS field effect transistor M3 can be effected with hardly any necessity of causing a current to flow through the pre-stage circuit. For this reason, the power consumption necessary for holding the high impedance condition of the output OUT can be remarkably reduced. When the buffer circuit is used by connecting it to the signal bus inside a microcomputer system, for example, the power consumption of the system can be drastically reduced. Also, it is possible to eliminate the CMOS enable control circuit 30 and to drive the gate of the transistor M3 directly with the output of the CMOS logic circuit inside the IC. In other words, the enable signal EN output from the CMOS circuit can directly drive the transistor M3 into its ON or OFF states.

Figure 3:
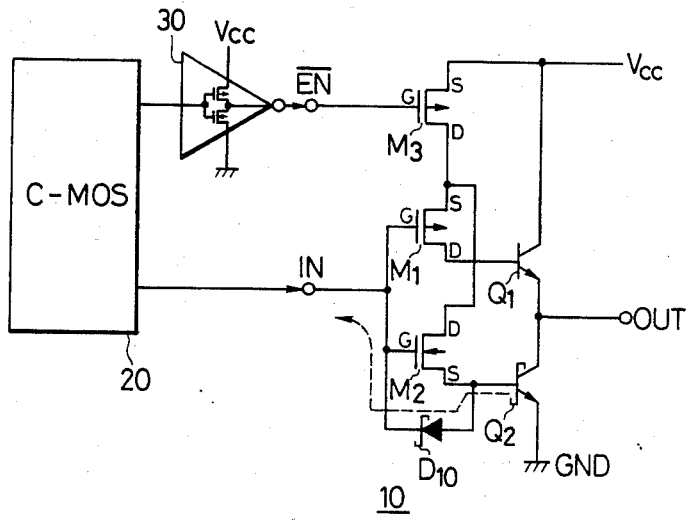
FIG. 3 is a circuit diagram of the buffer circuit in accordance with a second embodiment of the invention.

FIG. 3 shows the output buffer circuit in accordance with the second embodiment of the invention.

The output buffer circuit 10 shown in this drawing is fundamentally the same as the circuit shown in FIG. 2. In this embodiment, however, a Schottky barrier diode D10 is interposed between the base of the transistor Q2 on the ground potential side of the output stage and the buffer input IN. This diode D10 operates in such a fashion that when the input changes from "H" to "L" and the transistor Q2 is turned OFF, it extracts the base residual charge of the transistor Q2 towards the input side IN. This speeds up the switching of the transistor Q2 from ON to OFF, and sharpens the rise of the output OUT. In other words, the signal transmission speed of the output buffer circuit 10 can be sped up.

Figure 4:
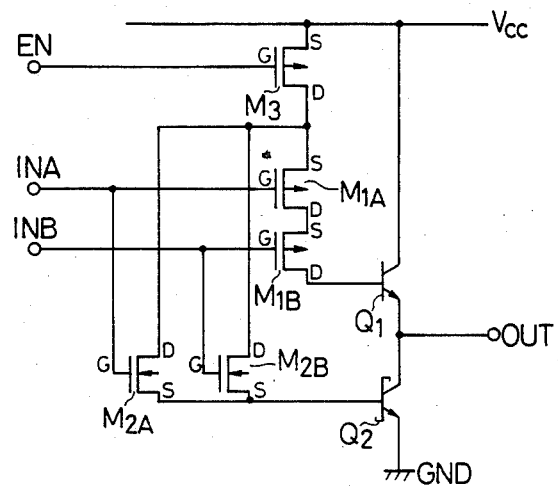
FIG. 4 is a circuit diagram of the buffer circuit in accordance with a third embodiment of the invention.

FIG. 4 shows the buffer circuit in accordance with the third embodiment of the invention. It should be noted that FIGS. 4 to 7 all only show a drive enable signal EN. It is, of course, understood that, in practice, the enable signal can be either a direct enable signal EN from the CMOS circuit 20 or the inverted signal $\overline{EN}$ from the enable control circuit 30 of FIGS. 2 and 3.

The output buffer circuit 10 shown in FIG. 4 is formed by providing the buffer circuit 10 shown in FIG. 2 with a logic function. Here, two p-channel MOS field effect transistors M1A and M1B, connected in series with each other, drive one of the transistors of the output stage, while two n-channel MOS field effect transistors M2A and M2B, that are connected in parallel with each other, drive the other of the transistors of the output stage, thereby obtaining the NOR logic function. The gates of the MOS field effect transistors M1A and M1B of one set are connected in common to those of the MOS field effect transistors M2A and M2B of the other set, and then to the two inputs INA and INB, respectively.

Figure 5:
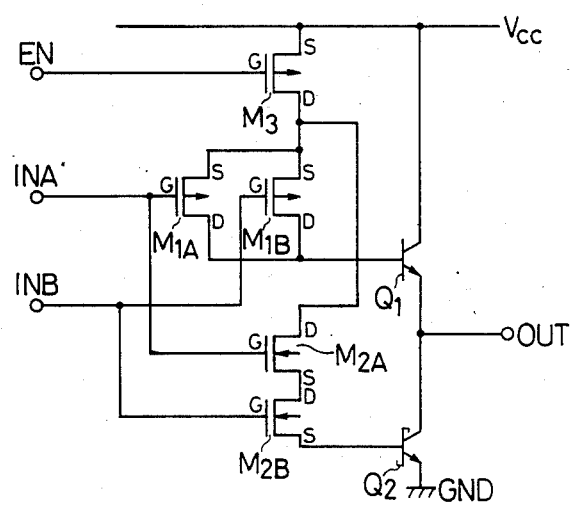
FIG. 5 is a circuit diagram of the buffer circuit in accordance with a fourth embodiment of the invention.

FIG. 5 shows the buffer circuit in accordance with the fifth embodiment of the invention.

The output buffer circuit 10 shown in this drawing is also formed by providing the buffer circuit 10 shown in FIG. 2 with the logic function. Here, two p-channel MOS field effect transistors M1A and M1B connected in parallel with each other, drive one (Q1) of the transistors of the output stage, while two n-channel MOS field effect transistors M2A and M2B connected in series with each other drive the other (Q2) of the transistors of the output stage, thereby obtaining the NAND logic function. The gates of the MOS field effect transistors M1A and M1B of one set are connected in common to the gates of the MOS field effect transistors M2A and M2B of the other set, and then to the two inputs INA and INB, respectively.

Figure 6:
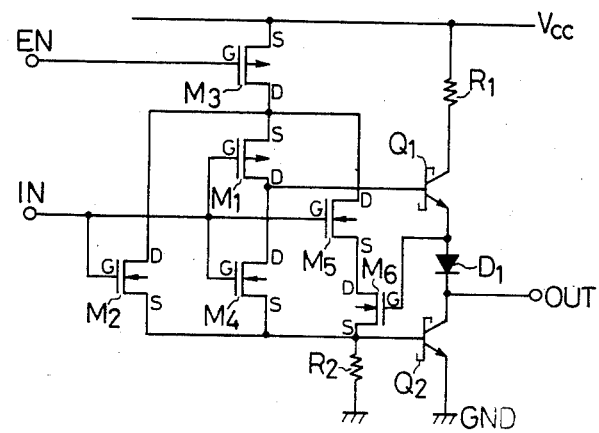
FIG. 6 is a circuit diagram of the buffer circuit in accordance with a fifth embodiment of the invention.

FIG. 6 shows the buffer circuit in accordance with the fifth embodiment of the invention.

The output buffer circuit 10 shown in this diagram is formed by adding n-channel MOS field effect transistors M4, M5 and M6, a diode D1 and a resistor R2 to the buffer circuit 10 shown in FIG. 2.

Referring to FIG. 6, if the input IN changes from "L" to "H" when the output OUT is in the active condition with the enable signal EN being "L", the n-channel MOS field effect transistor M4 is turned ON at the initial stage of this change, and the base residual charge of one (Q1) of the transistors of the output stage flow through the transistor M4 and is then discharged at a high speed while passing in parallel through the resistor R2 and through the base-emitter junction of the other (Q2) of the transistors of the output stage.

As the n-channel MOS field effect transistor M2 is turned ON, the n-channel MOS field effect transistor M5 is turned ON. During the transient stage where the output OUT changes from "H" to "L" in this instance, the n-channel MOS field effect transistor M6 remains instantially ON even after the input IN changes to "H", so that the turn-on time of the transistor Q2 can be shortened.

The diode D1 functions in such a manner that its shifts the gate impressed voltage of the MOS field effect transistor M6 to a higher side and keeps the MOS field effect transistor M6 turned ON until the level of the output OUT is reduced to "L" substantially reliably. In consequence, a large base current is instantaneously supplied from the power source Vcc to the other of the transistors of the output stage through the field effect transistors M3 and M5 and through the transistor M6 which is still kept ON.

As a result, the shift of one of the transistors of the output stage from ON to OFF and the shift of the other transistor from OFF to ON can be sped up, and the signal transmission speed in the output buffer circuit can be drastically improved.

The resistor R2 is disposed in order to extract the base residual charge of the other transistor of the output stage, and can be replaced by an MOS field effect transistor. The resistor R1, which is interposed in series on the power source side of the other output stage, is directed to limit the rush current.

Figure 7:
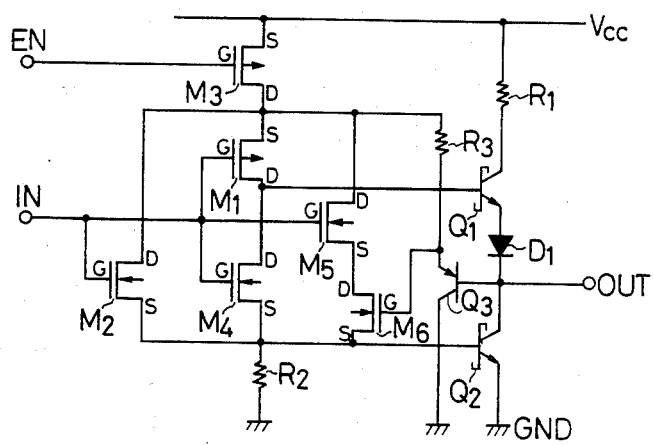
FIG. 7 is a circuit diagram of the buffer circuit in accordance with a sixth embodiment of the invention.

FIG. 7 shows the buffer circuit in accordance with the sixth embodiment of the invention.

In the circuit of the embodiment shown in FIG. 6, the gate electrode G of the MOS field effect transistor M6 is interposed between the transistor Q1 and the diode D1, so that a floating condition is established when the output OUT is "L". Therefore, a problem arises which stems from the fact that the switching operation of the MOS field effect transistor M6 is too slow. In other words, since the transistor Q2 is kept OFF even after the output stage transistor Q1 is turned ON, the diode D1 is cut off, and the gate electrode G of the transistor M6 is temporarily in the floating condition, and can not turn OFF the transistor M6 quickly enough.

In the sixth embodiment shown in FIG. 7, therefore, the voltage of the buffer output OUT is applied to the gate of the MOS field effect transistor M6 through an emitter follower consisting of a pnp transistor Q3 and a load resistor R3. This arrangement can improve the switching operation of the MOS field effect transistor M6, particularly its switching speed, when the output OUT changes from "H" to "L".

The load resistor R3 must be set to a value as high as possible in order to minimize the power consumption.

The transistor Q3 can also be replaced by a Schottky barrier diode.

Figure 8:
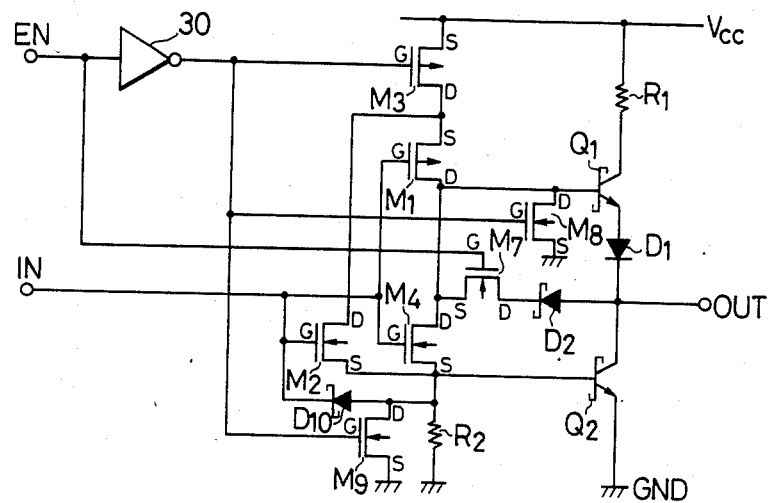
FIG. 8 is a circuit diagram of the buffer circuit in accordance with a seventh embodiment of the invention.

FIG. 8 shows the buffer circuit in accordance with the seventh embodiment of the invention.

The output buffer circuit 10 shown in the drawing is characterized in that a first switching element, with its conduction controlled by an external control signal, is disposed in series with the operating power supply path of the pre-stage circuit which complementarily drive the pair of bipolar transistors Q1 and Q2 of the output stage, and in that a second switching element with its conduction complementarily driven with respect to the first switching element described above is provided. This second switching element extracts the base residual charge of each of the bipolar transistors Q1 and Q2 of the output stage.

More definitely, the pre-stage circuit consists of the p-channel MOS field effect transistor M1 and the n-channel MOS field effect transistor M2 in the same way as in the embodiments described already. The control signal is the enble signal EN of the foregoing embodiments, and the p-channel MOS field effect transistor M3 is disposed as the first switching element with its conduction controlled by this enable signal EN. Furthermore, n-channel MOS field effect transistors M8 and M9 are disposed as the second switching element described above.

Also, an n-channel MOS field effect transistor M7 is disposed so as to connect the output OUT and the base of the other transistor Q2 of the output stage through the field effect transistor M4. When the input IN changes from "L" to "H" in the active condition of the output OUT, a current is instantaneously supplied from the output OUT to the base of the other transistor Q2 of the output stage through the MOS field effect transistors M7 and M4, thereby speeding up the shift of the output OUT from "H" to "L".

The MOS field effect transistor M7 is turned OFF when the output OUT is in the high impedance non-active condition. A Schottky barrier diode D2 is interposed in series between this MOS field effect transistor M7 and the output OUT. This diode D2 protects the drain junction of the transistor M7 and prevents the base current of one (Q1) of the transistors of the output stage from being bypassed to the output OUT side when the enable signal EN is "H" and the input IN is "L".

When the enable signal EN on the input side of the enable control circuit 30 consisting of the CMOS inverter is "H" in the output buffer circuit 10 described above, the field effect transistor M3 as the switching element is turned ON while the transistors M8 and M9 are turned OFF so that the output OUT is in the active condition, that is, in the enable state. Therefore, the buffer circuit 10 operates as a kind of inverter, and the logic state responding to the signal of the input IN appears at the output OUT. First, when the input In is at the low level, the MOS field effect transistor M1 and the transistor Q1 are turned ON, the MOS field effect transistors M2 and M4 are turned OFF, and the transistor Q2 is turned OFF, so that the high level appears at the output OUT. Next, when the input IN changes from the low level to the high, the MOS field effect transistor M1 is turned OFF, the transistor Q1 is also turned OFF, while the MOS field effect transistors M2 and M4 are turned ON and the transistor Q2 is turned ON, so that the output becomes the low level. In this case, the base current is applied to the base of the transistor Q2 through the MOS field effect transistors M7 and M4, so that the transistor Q2 is turned ON very rapidly, thereby improving the fall of the output. Next, when the input IN changes from the high level to the low, the base charge of the transistor Q2 is discharged very rapidly through the diode D10.

Next, the case when the control signal EN is at a low level will be discussed. In this case, the MOS field effect transistors M8 and M9 are turned On, the transistors Q1 and Q2 are turned OFF very rapidly and the output is in the high impedance condition. As a result, the operation of shifting the output OUT of the active condition to the high impedance non-active condition can be sped up remarkably. Therefore, if the output buffer circuit is used by connecting it to the signal bus inside a microcomputer system, for example, separation from the signal bus can be made rapidly; hence, the system operating speed can be improved.

Figure 9:
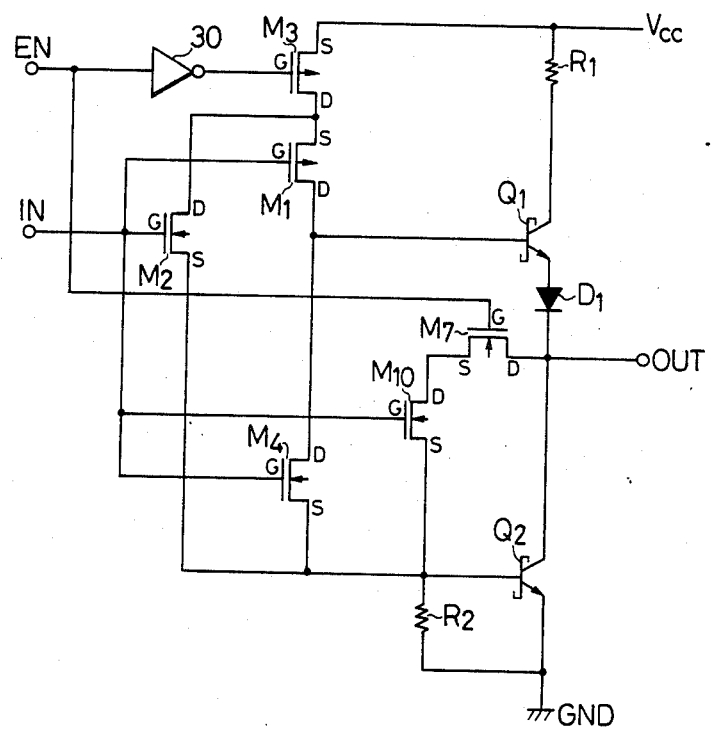
FIG. 9 is a circuit diagram of the buffer circuit in accordance with an eighth embodiment of the invention.

FIG. 9 shows the buffer circuit in accordance with the eighth embodiment of the invention.

In the output buffer circuit 10 shown in the drawing, n-channel MOS field effect transistors M7 and M10 that connect in series the output OUT to the base of the other Q2 of the transistors of the output stage are disposed. The conduction of one of the field effect transistors is controlled by the enable signal EN, and this transistor is turned ON when the output OUT is in the active condition. The conduction of the other of the field effect transistors is controlled by the input signal IN, and this transistor is turned ON when the input IN is "H", and is turned OFF when the input IN is "L".

In this embodiment, when the input IN changes from "L" to "H" in the active condition of the output OUT, the MOS field effect transistor M10 is turned ON from OFF, and a current is instantaneously supplied from the output out to the base of the other of the transistors of the output stage through the MOS field effect transistors M7 and M10, thereby speeding up the shift of the output OUT from "H" to "L".

Figure 10:
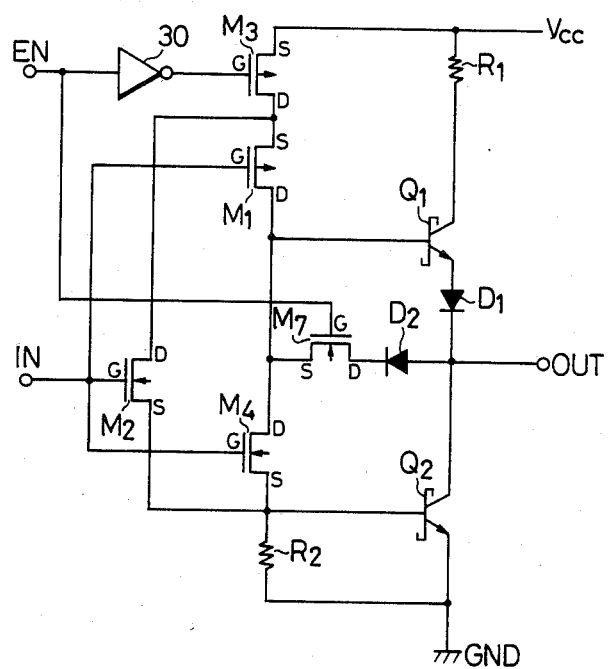
FIG. 10 is a circuit diagram of the buffer circuit in accordance with a ninth embodiment of the invention.

FIG. 10 shows the buffer circuit in accordance with the ninth embodiment of the invention.

In the output buffer circuit 10 shown in the drawing, the MOS field effect transistor M4 has the same function as the n-channel MOS field effect transistor M10 in FIG. 9, and the output circuit can exhibit substantially the same action and effect as that of the circuit shown in FIG. 9.

The diode D2, that is inserted between the field effect transistor M7 and the output OUT, prevents a part of the current supplied to the base of one of the transistors of the output stage through the MOS field effect transistors M3 and M1 when the enable signal EN is "H" and the input IN is "L", from being bypassed to the output OUT side.

The present invention provides the following effects.

(1) In the tri-state type buffer circuit having the output stage comprising a pair of bipolar transistors connected in series in the totem pole arrangement, the present invention interposes in series the switching element M3 in the operating power supply path of the pre-stage circuit which complementarily drives the bipolar transistors of the output stage, and controls the conduction of this switching element M3 with the external tri-state control signal. Therefore, the present invention provides the effect that the power consumption necessary for keeping its output in the high impedance non-active condition can be drastically reduced.

(2) The present invention interposes in series the switching element M3, with its conduction controlled by the external tri-state control signal, in the operating power supply path of the pre-stage circuit driving complementarily the pair of bipolar transistors of the output stage described above, and also disposes the second switching elements M8 and M9 which are complementarily driven with respect to the switching element M3 described above so as to extract the base residual charge of each of the bipolar transistors Q1 and Q2 of the output stage by the second switching elements M8 and M9. Therefore, the present invention can drastically speed up the operation of shifting the output from the active condition to the high impedance non-active condition. When the output buffer circuit is used by connecting it to the signal bus inside a micro-computer system, for example, separation from the signal bus can be made rapidly, and the system operation system can be therefore improved (see FIG. 8).

(3) The present invention disposes the MOS field effect transistor M4 which becomes conductive when the logic state of the buffer output changes from the high level "H" to the low level "L" in active condition, and supplies the base current from the buffer output OUT to the bipolar transistor Q2 on the low level "L" side of the output stage through the MOS field effect transistor M4 described above. Therefore, the present invention can speed up the switching speed of the buffer output OUT from "H" to "L".

Though the present invention has thus been described definitely with reference to some preferred embodiments thereof, the invention is not particularly limited thereto, but can of course be changed or modified in various manners without departing from the spirit and scope thereof. For example, the MOS field effect transistor M3 as the switching element can be replaced by a bipolar transistor.

Though the description has been directed primarily to the case where the invention is applied to the output buffer circuit technique of Bi/C-MOS which is the background and field of utilization of the invention, the invention is not particularly limited thereto, but can be applied to other arrangements as well, such as input buffer techniques. In other words, the invention can be applied to other switching circuits of the type for which at least the tri-state operation and the high driving output are requisite.

We claim:

1. A switching circuit comprising:
    an output stage having first and second bipolar transistors and having the collector-emitter paths thereof connected in series between a first operating potential and a second operating potential;
    a pre-stage circuit having a first field effect transistor having the drain output thereof coupled to the base of said first bipolar transistor to control conduction and non-conduction of said first bipolar transistor and a second field effect transistor having a conductivity type opposite to that of said first field effect transistor and the source output thereof coupled to the base of said second bipolar transistor to control conduction and non-conduction of said second bipolar transistor, the gates of said first and second field effect transistors being commonly connected to an input node and being driven in common by an input signal applied to said input node;
    a switching element connected between the source of said first field effect transistor as well as the drain of said second field effect transistor in said pre-stage circuit and said first operating potential, and having the conduction and non-conduction thereof controlled by an enable control signal to thereby control whether or not said pre-stage circuit receives said first operating potential;
    a third field effect transistor having a conductivity type opposite to that of said first field effect transistor, receiving said input signal at the gate thereof and having the drain thereof connected to the base of said first bipolar transistor and the source thereof connected to the base of said second bipolar transistor; and
    impedance means connected between the base of said second bipolar transistor and said second operating potential.

2. A switching circuit according to claim 1, which further includes a diode connected between the source and gate of said second field effect transistor.

3. A switching circuit according to claim 2, wherein said diode has an anode coupled to the source of said second field effect transistor and a cathode coupled to the gate of said second field effect transistor.

4. A switching circuit according to claim 1, wherein said switching element is a fourth field effect transistor having a gate coupled to receive said enable control signal and having its source-drain path coupled in series between said first operating potential and said first and second field effect transistors.

5. A switching circuit according to claim 4, which further includes:
    a first discharging field effect transistor having the conduction and non-conduction thereof controlled by said enable control signal applied to the gate thereof, and the drain-source path thereof connected between the base of said first bipolar transistor and said second operating potential; and
    a second discharging field effect transistor having the conduction and non-conduction thereof controlled by said enable control signal applied to the gate thereof, and the drain-source path thereof connected between the base of said second bipolar transistor and said second operating potential.

6. A switching circuit according to claim 1, wherein an output terminal is connected to a common junction between the collector-emitter paths of said first bipolar transistor and said second bipolar transistor.

7. A switching circuit according to claim 6, which further includes a fourth field effect transistor having the conduction and non-conduction thereof controlled by said enable control signal applied to the gate thereof and the drain-source path thereof connected between said output terminal and the drain of said third field effect transistor.

8. A switching circuit according to claim 7, which further includes a diode connected in series with the drain-source path of said fourth field effect transistor.

9. A switching circuit according to claim 6, further comprising a diode having its anode coupled to an emitter of said first bipolar transistor and its cathode coupled to said output terminal, a fourth field effect transistor having a conductivity type opposite to that of said first field effect transistor coupled to receive said input signal at a gate thereof and a fifth field effect transistor having a conductivity type opposite to that of said first field effect transistor and having a gate thereof coupled between an emitter of said first bipolar transistor and said diode, wherein said fourth and fifth field effect transistors are coupled to have their source-drain paths connected in series between a source of said first field effect transistor and said impedance means.

10. A switching circuit according to claim 6, which further includes a fourth field effect transistor having the conduction and non-conduction thereof controlled by said enable control signal being applied to the gate thereof and a fifth field effect transistor having the conduction and non-conduction thereof controlled by said input signal being applied to the gate thereof, wherein the drain-source path of said fourth field effect transistor is connected with the drain-source path of said fifth field effect transistor in series between said output terminal and the base of said second bipolar transistor.

11. A switching circuit according to claim 1, wherein said first and second bipolar transistors are of the same conductivity type.

12. A switching circuit according to claim 1, wherein said switching element is coupled in series between the first operating potential and the source-drain path said first and second field effect transistors.

13. A switching circuit in accordance with claim 1 wherein the drain of the first field effect transistor is connected to the base of said first bipolar transistor and the source of the second field effect transistor is connected to the base of the second bipolar transistor.

* * * * *